United States Patent
König et al.

[11] Patent Number: 5,948,379
[45] Date of Patent: Sep. 7, 1999

[54] PLASMA-CHEMICAL DEPOSITION OF VERY FINE PARTICLES

[76] Inventors: Udo König, Helgolandring 31, D-45149 Essen; Ralf Tabersky, In den Weywiessen 54, D-46240 Bottrop, both of Germany

[21] Appl. No.: 08/505,219
[22] PCT Filed: Jan. 22, 1994
[86] PCT No.: PCT/DE94/00047
    § 371 Date: Aug. 28, 1995
    § 102(e) Date: Aug. 28, 1995
[87] PCT Pub. No.: WO94/18357
    PCT Pub. Date: Aug. 18, 1994

[30] Foreign Application Priority Data

Feb. 6, 1993 [DE] Germany .............................. 43 03 492

[51] Int. Cl.⁶ ........................ C01B 21/00; C01B 31/00; C01B 13/00
[52] U.S. Cl. ........................ 423/411; 423/440; 423/592; 423/625; 204/164; 422/907
[58] Field of Search ............................ 204/164, 177, 204/157.51, 157.46, 157.47, 178, 173; 118/723 E; 423/592, 625, 440, 411; 422/907, 186.21; 427/576

[56] References Cited

U.S. PATENT DOCUMENTS

| | | | |
|---|---|---|---|
| 2,837,654 | 6/1958 | Berghaus et al. | 422/907 |
| 3,642,442 | 2/1972 | Hoekje et al. | 423/592 |
| 4,113,584 | 9/1978 | Johnson | 204/245 |
| 4,333,814 | 6/1982 | Kuyel | 204/298 |
| 4,450,787 | 5/1984 | Weakliem et al. | 118/723 ER |
| 4,769,064 | 9/1988 | Buss et al. | 204/177 |
| 4,806,333 | 2/1989 | Egerton et al. | 423/111 |
| 4,909,183 | 3/1990 | Kamiya et al. | 118/725 |
| 5,021,134 | 6/1991 | Blackburn et al. | 204/177 |
| 5,173,328 | 12/1992 | Reiter et al. | 427/576 |

FOREIGN PATENT DOCUMENTS

| | | |
|---|---|---|
| 0 064 884 | 11/1982 | European Pat. Off. . |
| 34 33 874 | 3/1986 | Germany . |
| 38 41 730 | 6/1990 | Germany . |
| 60-125374 | 7/1985 | Japan . |
| 3-173776 | 7/1991 | Japan . |

*Primary Examiner*—Steven Bos
*Attorney, Agent, or Firm*—Herbert Dubno; Andrew Wilford

[57] ABSTRACT

An apparatus for producing solid fine particulates has a substantially closed reaction vessel and a hollow gas input conduit inside the vessel formed with a multiplicity of similar outlet apertures each having a flow cross section of at most 2 mm². The conduit has an overall cross-sectional area equal to at least 100 times the flow cross section of a one of the apertures. A foraminous structure in the vessel surrounds the conduit and an electrode is provided in the vessel outside the foraminous structure. A direct-current power supply has a negative side connected to the foraminous structure and a positive side connected to the electrode while the input conduit is at ground potential so that a glow discharge is created in the vessel between the foraminous structure and the electrode. Input gases selected from the group consisting of gaseous metal chlorides, hydrogen, oxygen, nitrogen, and a carbon-containing gas in a mixture reacting in the presence of a glow discharge to produce particles are introduced into an interior of the conduit and gases are withdrawn from the vessel from outside the foraminous structure so that particles are freed from the input gases by the glow discharge and deposited in the vessel.

10 Claims, 1 Drawing Sheet

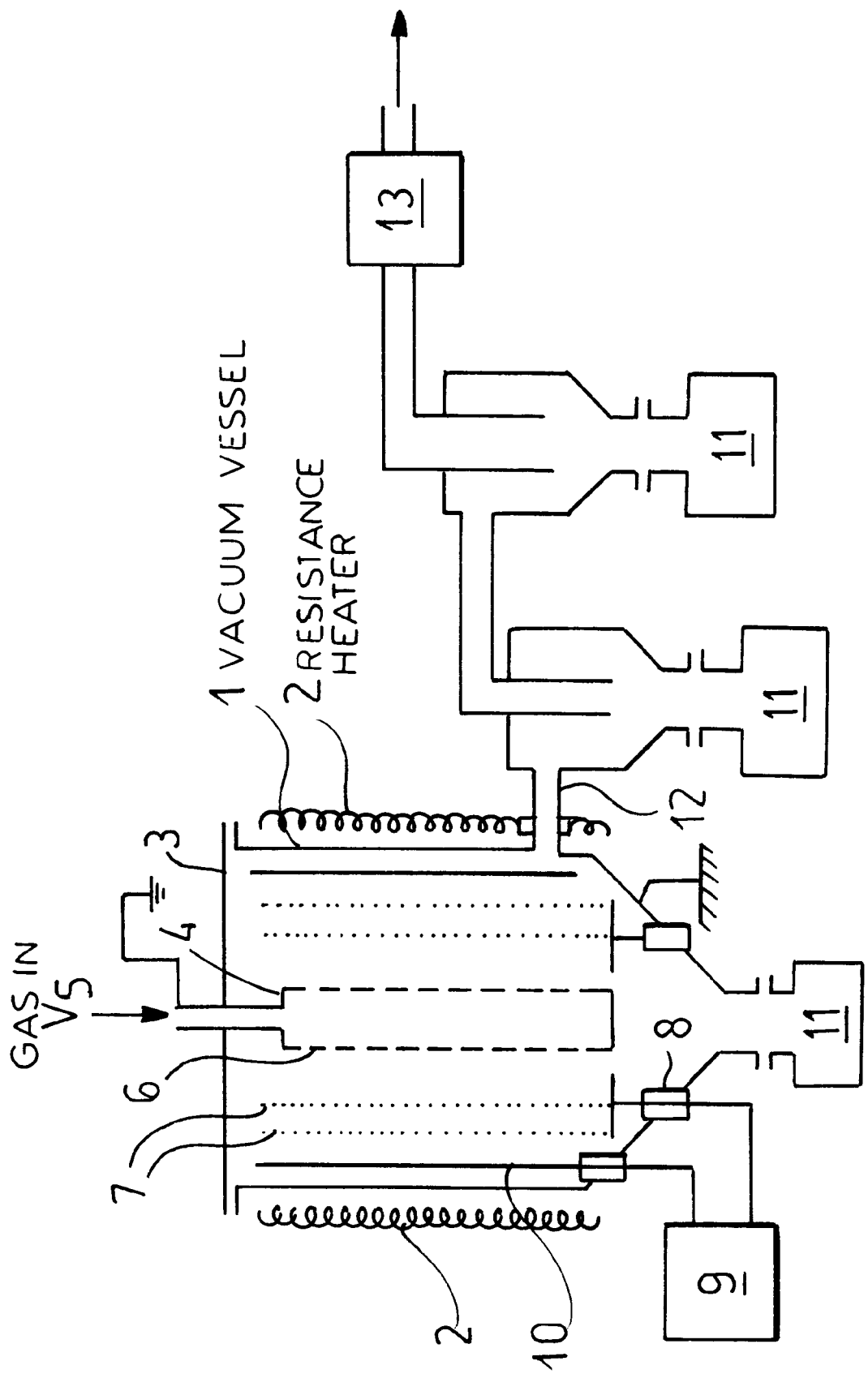

PLASMA-CHEMICAL DEPOSITION OF VERY FINE PARTICLES

CROSS REFERENCE TO RELATED APPLICATIONS

This application is the U.S. national phase of PCT application PCT/DE94/00047 filed Jan. 22, 1994 with a claim to the priority of German application P 43 03 492.6 itself filed Feb. 6, 1993.

FIELD OF THE INVENTION

The invention relates to an apparatus for depositing solid materials with a plasma-chemical process from gaseous metal chlorides, hydrogen, oxygen, and/or nitrogen and/or a carbon-containing gas in a reactive mixture ionized by glow discharge, using a reaction vessel into which a gas input opens with a plurality of outlet apertures. The invention further relates to a method of depositing solid materials by using a glow-discharge activated CVD method by means of metal chlorides, hydrogen, oxygen, and/or nitrogen and/or a carbon-containing gas in a reactive mixture that is fed at high speed into a reaction chamber in which a constant working pressure is maintained.

BACKGROUND OF THE INVENTION

The so-called CVD method where a solid material is formed from gaseous reaction materials has been normally used for many years to separate TiC or TiN by introducing titanium chloride and hydrogen and methane or nitrogen as carbon or nitrogen supply. It is similarly known to use aluminum chloride and carbon dioxide as donators for separating out $Al_2O_3$. The process parameters in a CVD method can be set so that no solid adhering deposit, only loose deposits (powder) are formed. The CVD method is carried out in heated reaction chambers partially under subatmospheric pressure. According to the concentration of the reaction partners in the vehicle gas as well as the temperature and flow velocity there are various deposition rates, compositions, and structures or textures of the layer.

It is particularly important to the plasma CVD method that one can operate at low temperatures. If the reaction gas is mixed in a low-pressure glow discharge with an unbalanced plasma, the charge carriers in the gas are accelerated by the existing electrical field. The free travel between two impacts is dependent on the particle density or the pressure. If the particle energy reaches the applied voltage, molecules or atoms can be excited to the point of disassociation or ionization making possible chemical reactions that could otherwise only take place at higher temperatures. In principle low-pressure plasmas are created by applying a constant direct-current voltage or a pulsed direct-current voltage to a cathode-polarized workpiece as for example described in German 3,841,731.

In U.S. Pat. No. 4,909,183 at first an evacuatable chamber is described in whose center is arranged a rotatable holder for the coating substrate. The substrate itself is surrounded by a cylindrical cathodic electrode which is connected with a high-frequency voltage source. The substrate serves as anode so that when voltage is applied to the cathode a low-pressure plasma is created. Disadvantageously the material deposits on the cathode with the gas outlet apertures so that after a short time the gas flow is accurately eliminated.

U.S. Pat. No. 4,991,542 describes a reaction chamber in whose center is arranged a substrate body connected with a high-frequency sources and to whose sides there are diametrally opposite electrodes also serving as gas infeeds. The electrodes are formed as funnels and have multiple gas outlet apertures directed like a shower toward the substrate. Instead of connecting the voltage source with the substrate or with the substrate holder, it is connected with mesh electrodes which are arranged on both sides between the substrate and the gas-shower electrodes.

In European 0,257,620 a method and apparatus for forming a layer by a plasma-chemical process is described where at least three electrodes, preferably connected to a high-frequency source, are used which are arranged in a reaction chamber that is evacuatable and chargeable with gas. The substrate surface should extend perfectly or nearly perfectly parallel to an electrical field formed between the electrodes. The gas necessary to form the layer should flow between the and/or through the electrodes directly on the surfaces. The potential of succeeding electrodes should increase regularly. The electrodes build a containment which corresponds to the path of the electrical field formed between the electrodes. The electrodes can be formed as hollow cylinders and have outlet apertures for the gas. It is also possible to use annular electrodes which are arranged coaxial to the substrate having the surfaces like cylinders or electrodes that are arranged on the periphery of a cylinder.

Devices for plasma CVD coating are known from EP 0,503,820 which have multiple hollow cylindrical gas infeeds that are polarized as cathodes and have an inside diameter of about 1.9 cm and a length of 38.8 cm. The hollow gas infeed cylinders have several rows of outlet apertures each with six individual aligned openings. Data about the size of the openings is not given.

The inflow velocity gradient for the reaction gas should be according to the method described in EP 0,402,675 greater than 1050 cm/(cm.sec).

OBJECT OF THE INVENTION

It is an object of the present invention to provide a method and apparatus wherein there is a uniform gas distribution in the reactor without the danger that the outlet apertures of the gas infeed get plugged. The necessary constructive and/or method expedients should be minimal.

SUMMARY OF THE INVENTION

This object is achieved according to the apparatus which is characterized according to the invention in that the gas input conduit extends as at least one elongated hollow body (with a large number of outlet apertures each with a maximum cross-sectional area of 2 $mm^2$) with a cross section more than 100 times greater than the cross section of the outlet apertures, the hollow body being at ground potential and surrounded by a cathode-polarized mesh or a flat structure formed with many openings, with the quotient of the cross-section of the individual holes/cross-section of the hollow body <1/100.

The depositions are according to the invention solid powdery particles or even loose or solid adhering depositions on the cathode. It is possible to make from the recovered powdery extremely fine-particulate material according to the invention by means of a known ceramic sintering process materials with high-value technical characteristics. With the present invention the basically known chemical gas-phase reactions are used. For example it is also known from the state of the art to recover fine-particulate aluminum-oxide powder under the following circumstances:

At a temperature of 1010° C. and a pressure of 101.2 kPa a mixture by mass of 4% aluminum chloride, 12% carbon dioxide, and 84% hydrogen is fed into the reaction chamber. The known chemical reaction produces aluminum oxide powder with an average particle size of about 300 to 5600 nm in diameter. In order to get finer powder, the reaction temperature is decreased but the reaction output decreases substantially. With the present invention it is possible at low temperatures starting at about 500° C. and upward to obtain very fine-particulate deposits. To accelerate the chemical reaction the reactive gas mixture is subjected to a plasma condition. With a glow discharge produced in the gas chamber a certain portion of the gas molecules are ionized or fragmented by electron collisions. This activation of the reactive gas causes the chemical reaction for forming solid deposits to work at low temperatures. In addition the particular problem is avoided of only getting sufficiently high electrical field strengths to produce a large ionization density only in the immediate vicinity of the cathode (so-called cathode drop). An uncontrolled throughflowing of a cathode by the reactive gas is all alone not enough. The above-described dimensions are important since they ensure a very accurately dosed and finely divided feed of the gas mixture in the plasma-chemical reaction, surprisingly the many small outlet apertures do not get smaller after many hours of use of the apparatus since deposits are eliminated although the openings are constantly traversed by a highly reactive gas mixture. All other parts subjected to the reactive-gas atmosphere are covered by the process with a solid coating, even the outside of the cylindrical body or bodies that are formed with the openings.

Thus preferably the hollow body has an inner free cross section of more than 200 mm$^2$ and is provided with more than 400 outlet apertures each having a cross section of less than 1 mm$^2$. According to the present invention it is also possible to provide a single hollow body centrally in the reaction vessel or several hollow bodies. The hollow bodies can either be of cylindrical, oval, or polygonal, preferably rectangular, section.

The object is further achieved when the gas is fed with a speed of more than 50 m/sec and is directed radially. The working pressure is between 100 to 500 Pa. The gas-flow velocity is as high as possible, in particular more than 200 m/sec.

Finally according to a further embodiment of the invention a pulsed direct-current voltage is applied to the mesh-work. The method is in principle described in German 3,841,730.

According to the invention the described method is used for depositing very fine powders of oxides, carbides, and nitride, in particular of aluminum oxide, titanium carbide, and titanium nitride or for depositing solid adhering layers of oxides, carbides, and nitride, in particular of aluminum oxide, titanium carbide, and titanium nitride.

BRIEF DESCRIPTION OF THE DRAWING

An embodiment of the invention is shown in the drawing which is a schematic sectional view of an apparatus according to the invention.

SPECIFIC DESCRIPTION

The reaction vessel formed as a vacuum vessel 1 can be heated by an electrical resistance heater 2. The cover 3 of the vacuum vessel holds a cylindrical hollow body 4 which like the vacuum vessel 1 is grounded. The reactive gas mixture is fed in through the conduit 5 to the hollow cylindrical body 4. The hollow cylindrical body 4 has in its wall equidistant apertures 6 which each have a cross-sectional area of 0.79 mm$^2$. Altogether the hollow cylindrical body 4 has 4,510 such apertures. Surrounding the hollow cylindrical body 4 is at least one wire mesh 7 (in the present case two wire meshes 7) of corrosion-resistant steel which are connected via a feed-through fitting 8 with a power supply 9 that produces a pulsed direct-current voltage. The wire meshes 7 are polarized as cathodes. The anode is a sheet-metal cylinder 10 that surrounds the mesh 7. Below the vacuum vessel is a receptacle 11 for receiving the powdery reaction product. Further receptacles 11 are provided in the output-gas line 12 between the vacuum vessel 1 and the vacuum pump 13. These receptacles 11 extract the powder phase from the gas stream. The entire vacuum vessel with hollow cylindrical body, wire mesh, and anode plate is formed concentric around the hollow cylindrical body.

In a special trial test reaction gases at 650° C. and a pressure of 300 Pa are passed at 1200 l/h through the hollow cylindrical body and its apertures 6 with a flow velocity of 240 m/s. The gas is by mass 8% aluminum chloride, 15% carbon dioxide, and 77% hydrogen. The power supply delivers pulse direct current with a maximum pulse voltage of 700 V and a current of 22 A with a pulse duration of 600 $\mu$s and a pulse-pause duration of 100 $\mu$s. The method is run such that the larger portion of the solid reaction products drops out as powder and is trapped in the receptacles 11. The remaining portion is left lying on or sticking to the meshes working as cathode and can at the end of the process be freed by shaking or deforming the elastic meshes. The recovered aluminum-oxide powder is tested and analyzed by an electron microscope. The particle size of the aluminum oxide is measured between 50 and 200 nm.

The process according to the invention is particularly suited for making very fine oxide powders. When used with gas mixtures for precipitating out nitrides or carbides the portion recovered as powder is less. When used with gas mixtures of titanium tetrachloride, methane, and water there are deposits that stick to the mesh cathodes 7. In this case the output of powder even when using metal-donor rich gas mixtures is relatively small. A crusting up of the small gas throughflow apertures 6, such as seen in the prior-art methods, was not seen in tests for depositing of metal carbides and metal nitrides so long as the inventive features are maintained.

The tests proved that with gas mixtures with low saturation levels of the metal chlorides solid adhering coatings can form on the cathodically polarized mesh structure and on substrate bodies, e.g. of hard metal, cermet, or high-speed tool steel, that are secured there. Even this observation is in line with the method of the invention.

We claim:

1. A method of producing solid fine particulates, the method comprising the steps of;

introducing at a flow velocity of at least 50 m/sec into an interior of a perforated input body input gases including gaseous metal chlorides and withdrawing gases from a vessel surrounding the input body;

grounding the input body;

applying a direct-current negative potential to a structure surrounding the input body in the vessel; and applying a direct-current positive potential to an electrode in the vessel outside the structure to create a glow discharge between the structure and the electrode, whereby particles are freed from the input gases by the glow discharge and deposited in the vessel.

2. The method defined in claim 1 wherein the input gases are introduced at a rate to maintain the vessel at a pressure of between 100 Pa and 500 Pa and the flow velocity is at least 200 m/sec.

3. The method defined in claim 1 wherein the direct-current potential is pulsed.

4. The method defined in claim 1 wherein the input gases are forced to flow through the input body through a multiplicity of outlet apertures each of a flow cross section of at most 2 $mm^2$.

5. The method defined in claim 1 wherein the input gases are a mixture of aluminum chloride, carbon dioxide, and hydrogen.

6. An apparatus for producing solid fine particulates, the apparatus comprising:

a reaction vessel;

a hollow gas input body inside the vessel formed with a multiplicity of similar outlet apertures each having a flow cross section of at most 2 $mm^2$, the body having an overall cross-sectional area equal to at least 100 times the flow cross section of one of the apertures;

a structure in the vessel surrounding the body;

an electrode in the vessel outside the structure;

means including a direct-current power supply having a negative side connected to the structure and a positive side connected to the electrode, the input body being at ground potential, whereby a glow discharge is created in the vessel between the structure and the electrode; and pump means for introducing into an interior of the body input gases including gaseous metal chlorides, for withdrawing gases from the vessel from outside the structure, for freeing particles from the input gases by glow discharge, and for depositing the particles in the vessel.

7. The apparatus defined in claim 6 wherein the hollow gas input body has a free cross section of more than 200 $mm^2$ and is provided with at least 400 of the outlet apertures, and each aperture has a flow cross section of less than 1 $mm^2$.

8. The apparatus defined in claim 6 wherein the body is generally cylindrical.

9. The apparatus defined in claim 6 wherein the pump means introduces the input gases at such a pressure that it flows through the apertures at a speed of at least 50m/sec.

10. The apparatus defined in claim 6 wherein the source delivers pulsed direct-current voltage to the structure and electrode.

* * * * *